United States Patent
Ye et al.

(10) Patent No.: US 11,776,835 B2
(45) Date of Patent: Oct. 3, 2023

(54) POWER SUPPLY SIGNAL CONDITIONING FOR AN ELECTROSTATIC CHUCK

(71) Applicant: Applied Materials, Inc., Santa Clara, CA (US)

(72) Inventors: Zheng John Ye, Santa Clara, CA (US); Daemian Raj Benjamin Raj, Fremont, CA (US); Rana Howlader, Santa Clara, CA (US); Abhigyan Keshri, Sunnyvale, CA (US); Sanjay G. Kamath, Fremont, CA (US); Dmitry A. Dzilno, Sunnyvale, CA (US); Juan Carlos Rocha-Alvarez, San Carlos, CA (US); Shailendra Srivastava, Fremont, CA (US); Kristopher R. Enslow, San Jose, CA (US); Xinhai Han, Santa Clara, CA (US); Deenesh Padhi, Sunnyvale, CA (US); Edward P. Hammond, Hillsborough, CA (US)

(73) Assignee: Applied Materials, Inc., Santa Clara, CA (US)

( * ) Notice: Subject to any disclaimer, the term of this patent is extended or adjusted under 35 U.S.C. 154(b) by 336 days.

(21) Appl. No.: 17/036,048

(22) Filed: Sep. 29, 2020

(65) Prior Publication Data

US 2022/0102179 A1    Mar. 31, 2022

(51) Int. Cl.
| | | |
|---|---|---|
| *H01L 21/683* | (2006.01) | |
| *H01L 21/67* | (2006.01) | |
| *H01J 37/32* | (2006.01) | |

(52) U.S. Cl.
CPC .... *H01L 21/6833* (2013.01); *H01J 37/32183* (2013.01); *H01J 37/32697* (2013.01);
(Continued)

(58) Field of Classification Search
CPC ........... H01L 21/6833; H01L 21/67069; H01L 21/67103; H01J 37/32183; H01J 37/32697; H01J 37/32724
See application file for complete search history.

(56) References Cited

U.S. PATENT DOCUMENTS

| 10,435,789 B2 | 10/2019 | Tsuji et al. |
| 2008/0084650 A1 | 4/2008 | Balasubramanian et al. |
(Continued)

FOREIGN PATENT DOCUMENTS

| CN | 106575634 A | 4/2017 |
| EP | 0992106 B1 | 8/2005 |
(Continued)

OTHER PUBLICATIONS

Liang et al., "Design of a 50 Hz notch Filter using the Universal Active Filter Chip UAF42", Chinese Journal of Scientific Instrument, vol. 27, No. 8, Aug. 2006, pp. 924-927.
(Continued)

*Primary Examiner* — Renan Luque
(74) *Attorney, Agent, or Firm* — Kilpatrick Townsend & Stockton LLP (57) ABSTRACT

Exemplary semiconductor processing systems may include a processing chamber and an electrostatic chuck disposed at least partially within the processing chamber. The electrostatic chuck may include at least one electrode and a heater. A semiconductor processing system may include a power supply to provide a signal to the electrode to provide electrostatic force to secure a substrate to the electrostatic chuck. The system may also include a filter communicatively coupled between the power supply and the electrode. The filter is configured to remove or reduce noise introduced into the chucking signal by operating the heater while the electrostatic force on the substrate is maintained. The filter may include active circuitry, passive circuitry, or both, and
(Continued)

may include an adjustment circuit to set the gain of the filter so that an output signal level from the filter corresponds to an input signal level for the filter.

20 Claims, 7 Drawing Sheets

(52) U.S. Cl.
CPC .. *H01J 37/32724* (2013.01); *H01L 21/67069* (2013.01); *H01L 21/67103* (2013.01)

(56) References Cited

U.S. PATENT DOCUMENTS

| | | | |
|---|---|---|---|
| 2016/0049323 A1* | 2/2016 | Ye | H01L 21/6833 361/234 |
| 2017/0162417 A1* | 6/2017 | Ye | C23C 16/4586 |
| 2020/0150164 A1 | 5/2020 | Ulrich et al. | |

FOREIGN PATENT DOCUMENTS

| | | |
|---|---|---|
| TW | 201731131 A | 9/2017 |
| TW | 201822245 A | 6/2018 |
| WO | 2017-100136 A1 | 6/2017 |

OTHER PUBLICATIONS

International Search Report and Written Opinion dated Jan. 10, 2022 in International Patent Application No. PCT/US2021/051493, 10 pages.
Carter et al., "Op Amps for Everyone", Analog Signal Chain and Power Supply Specialist, Fifth Edition, 2018, 486 pages.

\* cited by examiner

POWER SUPPLY SIGNAL CONDITIONING FOR AN ELECTROSTATIC CHUCK

TECHNICAL FIELD

The present technology relates to components and apparatuses for semiconductor manufacturing. More specifically, the present technology relates to electrostatic chucking components and other semiconductor processing equipment.

BACKGROUND

Integrated circuits are made possible by processes that produce intricately patterned material layers on substrate surfaces. Producing patterned material on a substrate requires controlled methods of formation and removal of exposed material. As device sizes continue to shrink, materials deposited may impart stresses on substrates, which may result in bowing of the substrate. During subsequent deposition operations, wafer bow may influence contact across a substrate support, which can affect heating. A non-uniform heating profile across the substrate can affect subsequent deposition operations, causing non-uniform deposition across the surface of the substrate.

Thus, there is a need for improved systems and methods that can be used to produce high quality devices and structures. These and other needs are addressed by the present technology.

SUMMARY

Exemplary semiconductor processing systems may include a processing chamber and an electrostatic chuck disposed at least partially within the processing chamber. The electrostatic chuck may include at least one electrode and a heater. The semiconductor processing system may include a power supply to provide a signal to the electrode to provide electrostatic force to secure a substrate to the electrostatic chuck. The semiconductor processing system may also include a filter communicatively coupled between the power supply and the electrode. The filter is configured to remove noise introduced by operating the heater while the electrostatic force on the substrate is maintained.

In some embodiments, the filter may include a passive circuit including multiple resistors and capacitors, an inductor, or both. The filter may include a circuit configured to provide an attenuation of at least 40 dB at a designed frequency from 45 Hz to 65 Hz with the heater maintaining a temperature of the substrate from 550 C to 650 C. The filter may include a twin-T band rejection circuit, wherein a first T-circuit includes at least one resistor having a resistance value about twice that of a resistor in a second T-circuit and a capacitor having a capacitance value about twice that of at least one capacitor in the second T-circuit. The filter may include both a passive stage an active stage. The active stage may include an operational amplifier and an adjustment circuit communicatively coupled to the operational amplifier for setting a gain of the filter so that an output signal level from the filter corresponds to an input signal level for the filter.

Some embodiments of the technology encompass semiconductor processing methods. The methods may include applying a chucking voltage to an electrostatic chuck supporting a substrate in a semiconductor processing chamber and energizing a heater to raise a temperature of the substrate. The methods may also include filtering a power supply signal providing the chucking voltage to remove noise introduced to the power supply signal by the heater while an electrostatic force on the substrate is maintained. The methods may further include setting a gain applied to the power supply signal during the filtering so that an output signal level corresponds to an input signal level. The methods may also include processing the substrate in the semiconductor processing chamber. In some embodiments, the filtering may be accomplished using one or more of the filter circuits and configurations described above.

Exemplary power supply systems may include a power supply configured to provide a signal to an electrode in an electrostatic chuck and a filter communicatively coupled to the power supply. The filter is configured to remove noise introduced by operating a heater in the electrostatic chuck while an electrostatic force on a substrate is maintained. The filter may include an operational amplifier and an adjustment circuit communicatively coupled to the operational amplifier for setting a gain of the filter so that an output signal level from the filter corresponds to an input signal level. The filter may include any of the filtering circuits and configurations discussed above. In some embodiments, the power supply mentioned as part of exemplary power supply systems and/or as part of exemplary semiconductor processing systems may be configured to provide a voltage that varies over time as a square wave of a frequency around 20 Hz, a duty cycle around 20%, a magnitude of around +/−1000 V, and a substantially 0 V offset.

BRIEF DESCRIPTION OF THE DRAWINGS

A further understanding of the nature and advantages of the disclosed technology may be realized by reference to the remaining portions of the specification and the drawings.

Several of the figures are included as schematics. It is to be understood that the figures are for illustrative purposes, and are not to be considered of scale unless specifically stated to be of scale. Additionally, being schematic in nature, the figures are provided to aid comprehension and may not include all aspects or information compared to realistic representations. The figures may include exaggerated material for illustrative purposes.

In the appended figures, similar components and/or features may have the same reference label. Further, electronic components of the same type may be distinguished by a letter and number, where the number distinguishes among the similar components.

DETAILED DESCRIPTION

Many material deposition processes may be temperature sensitive. In a variety of processing systems, the substrate support may operate as a heat source for a substrate during deposition. As fabrication processes are performed, a number of layers of material may be formed over a substrate, which may impart a number of stresses on the substrate. In many instances, these stresses may cause an amount of bowing of the substrate. Chucking with an electrostatic chuck (ESC) may counteract a number of bowing effects to maintain a flatter substrate, which may maintain more uniform contact across the substrate support, which may in turn maintain more uniform heating across the substrate.

When the ceramic heater in a processing chamber is running at high temperatures, it is semiconductive. For example, the resistance of aluminum nitride ceramic materials can drop to approximately 20 kΩ when carrying current through the wafer and ESC surface to ground. The lowered resistance can create a noise path between the heater and the chucking power supply system components. The heater elements are usually carrying an AC voltage and current of, for example, 208 VAC RMS at 60 Hz. The AC voltage and current running through portions of the semiconductive materials may be coupled through the ESC electrode and to the ESC power supply affecting the regulation of the power supply. Portions of the AC power, voltage and current being used for the heater elements may be superimposed on top of the chucking voltage and current, causing poor chucking power supply regulation, which can lead to perturbations in the chucking force. Such perturbations can in turn lead to unintended deformation of the substrate and resulting imperfections in deposition.

The present technology overcomes these challenges by utilizing one or more chucking power conditioning mechanisms to remove unwanted voltage and current noise in the chucking power. For example, a filter can be provided. The filter is configured to remove or reduce noise introduced into the chucking signal by operating the heater. The filter may include active circuitry, passive circuitry, or both, and may include an adjustment circuit to set the gain of the filter so that an output signal level from the filter corresponds to an input signal level for the filter. Accordingly, improved film formation and removal, as well as improved film properties, may be afforded.

Although the remaining disclosure will routinely identify specific deposition processes utilizing the disclosed technology, it will be readily understood that the systems and methods are equally applicable to other deposition and cleaning chambers, as well as processes as may occur in the described chambers. Accordingly, the technology should not be considered so limited as to be for use with these specific deposition processes or chambers alone. The disclosure will discuss one possible system and chamber that may include lid stack components according to embodiments of the present technology before additional variations and adjustments to this system according to embodiments of the present technology are described.

Figure 1:
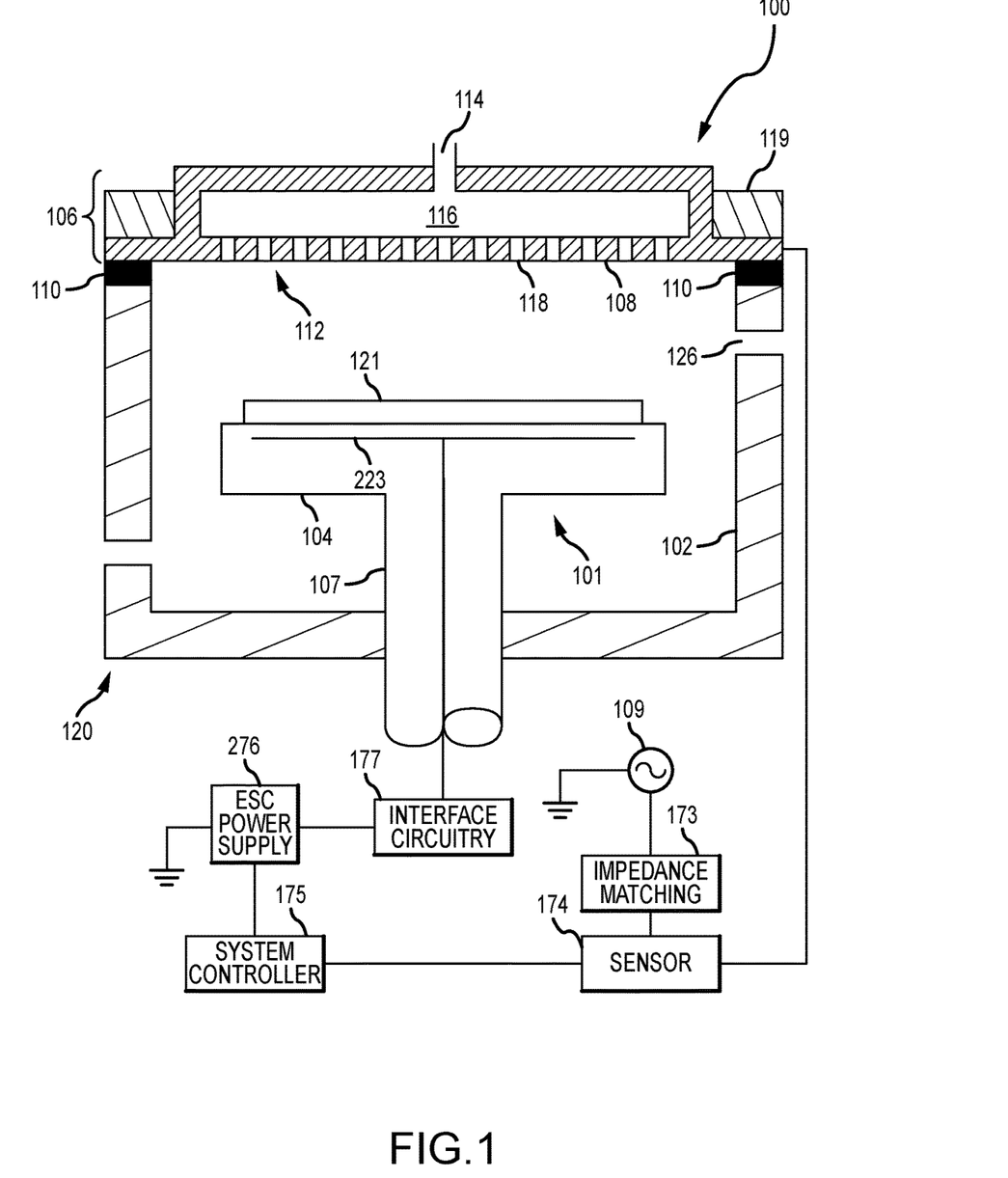
FIG. 1 shows a schematic cross-sectional view of an exemplary processing system according to some embodiments of the present technology.

FIG. 1 shows a schematic cross-sectional view of an exemplary semiconductor processing system according to some embodiments of the present technology. As shown, the processing system 100 may be an etch chamber suitable for etching a substrate 121. The processing system 100 may be used for various plasma processes. For example, the processing system 100 may be used to perform dry etching with one or more etching agents. The processing system may be used for ignition of plasma from a precursor $C_xF_y$, (where x and y represent values for known compounds), $O_2$, $NF_3$, or combinations thereof. In another example, the processing chamber 100 may be used for a plasma-enhanced chemical vapor deposition (PECVD) process with one or more precursors.

The system includes a processing chamber 120 having a chamber body 102, a lid assembly 106, and an electrostatic chuck 101. The electrostatic chuck 101 includes support stem 107 and chuck body 228. While a portion of the support stem may protrude from the chamber, the electrostatic chuck is at least partially contained within the processing chamber during operation. The lid assembly 106 is positioned at an upper end of the chamber body 102. The chuck body 228 may be contained inside the chamber body 102, and the lid assembly 106 may be coupled to the chamber body 102 and enclose the chuck body 228 in the processing chamber. The chamber body 102 may include a transfer port 126, which may include a slit valve, formed in a sidewall of the chamber body 102. The transfer port 126 may be selectively opened and closed to allow access to an interior of the processing chamber 120 by a substrate handling robot (not shown) for substrate transfer.

An electrode 108 may be provided as a portion of the lid assembly 106. The electrode 108 may also function as a gas distributor plate 112 having a plurality of openings 118 for admitting process gas into the interior of processing chamber 120. The process gases may be supplied to the processing chamber 120 via a conduit 114, and the process gases may enter a gas-mixing region 116 prior to flowing through the openings 118. The electrode 108 may be coupled to a source of electric power, such as RF generator 109. An isolator 110 may contact the electrode 108 and separate the electrode 108 electrically and thermally from the chamber body 102. The isolator 110 may be constructed using a dielectric material such aluminum oxide, aluminum nitride, and/or other ceramics or metal oxides. A heater 119 may be coupled to the gas distributor plate 112. The heater 119 may also be coupled to an AC power source (not shown).

The chuck body 104 may be formed from a metallic or ceramic material. For example, a metal oxide, nitride, or oxide/nitride mixture may be used such as aluminum, aluminum oxide, aluminum nitride, an aluminum oxide/nitride mixture, and/or other similar materials. In typical implementations, one or more pedestal electrodes may be included in the chuck body 104. One or more pedestal electrodes (not shown) may be configured to deliver RF energy to a plasma in the interior of processing chamber 120.

The electrostatic chuck 101 is configured for supporting and holding a substrate being processed. In one embodiment, the electrostatic chuck 101 may comprise at least one electrode 223 to which a voltage is applied to electrostatically secure a substrate thereon. The electrode 223 is powered by a power supply 276 connected to the electrode 223 via interface circuitry 177. The electrostatic chuck 101 may be monopolar, bipolar, tripolar, DC, interdigitated, zonal and the like.

In one embodiment, the electrostatic chuck 101 may comprise heating elements, for example resistive elements, to heat a substrate positioned thereon to a desired process temperature. Alternatively, the electrostatic chuck 101 may be heated by an outside heating element such as a lamp assembly. RF source 109 is coupled to the electrode 108 through an impedance matching circuit 173. The electrode 223 can provide both a ground path for the RF source 109 and an electric bias from power supply 276 to enable electrostatic clamping of the substrate 121.

The RF source 109 may comprise a high frequency radio frequency (HFRF) power source, e.g., a 13.56 MHz RF generator, and a low frequency radio frequency (LFRF) power source, e.g., a 300 kHz RF generator. The LFRF power source provides both low frequency generation and fixed match elements. The HFRF power source is designed for use with a fixed match and regulates the power delivered to the load, eliminating concerns about forward and reflected power.

In certain embodiments, properties of the substrate 121 secured on chuck body 104 may be monitored during a plasma process. In certain embodiments, properties may be monitored by measuring characteristics of the electrostatic chuck 101 with the substrate secured thereon. Characteristics of the electrostatic chuck 101 may be measured by a sensor 174 connected with a distributor plate 112. The sensor 174 may be a VI probe connected between the distributor plate 112 and the impedance matching circuit 173. In some embodiments, the sensor 174 may be configured to measure capacitance between the distributor plate 112 and the electrode 223 since capacitance between the distributor plate 112 and the electrode 223 is effected by the flatness of the substrate 121. An electrostatic chuck may have an increased capacitive reactance when a substrate disposed thereon becomes less flat. When a substrate is not flat, for example deformed from the heat of the plasma, there is non-uniform distribution of air gap between the substrate and the electrostatic chuck. Therefore, variation in flatness of the substrate in an electrostatic chuck results in variation of capacitance of the plasma reactor, which may be measured. In such a case, the sensor 174 may be configured to measure impedance of the electrostatic chuck 101 by measuring voltage and current of the capacitor formed by the distributor plate 112 and the electrode 223, thereby monitoring the flatness of a substrate secured thereon.

During a plasma process, a substrate positioned on an electrostatic chuck may increase in curvature due to deformation from heating, increased thickness of deposited film, loss of chucking power, or the combination thereof. The deformation of the substrate may increase non-uniformity of the process. In one embodiment, flatness of the substrate being processed may be monitored by measuring characteristics of an electrostatic chuck that secures the substrate. Depending upon the predetermined conditions, chucking voltage of the electrostatic chuck may be adjusted to correct substrate deformation. The sensor 174 may be connected to a system controller 175. The system controller 175 may be configured to calculate and adjust the flatness of the substrate 121 being processed in the system 100. In one embodiment, the system controller 175 may calculate flatness or chucking status of the substrate 121 by monitoring characteristics, such as imaginary impedance, of the electrostatic chuck 101. When measuring the impedance indicates that the substrate 121 decreases in flatness, the system controller 175 may increase chucking power by adjusting the power supply 276.

Figure 2:
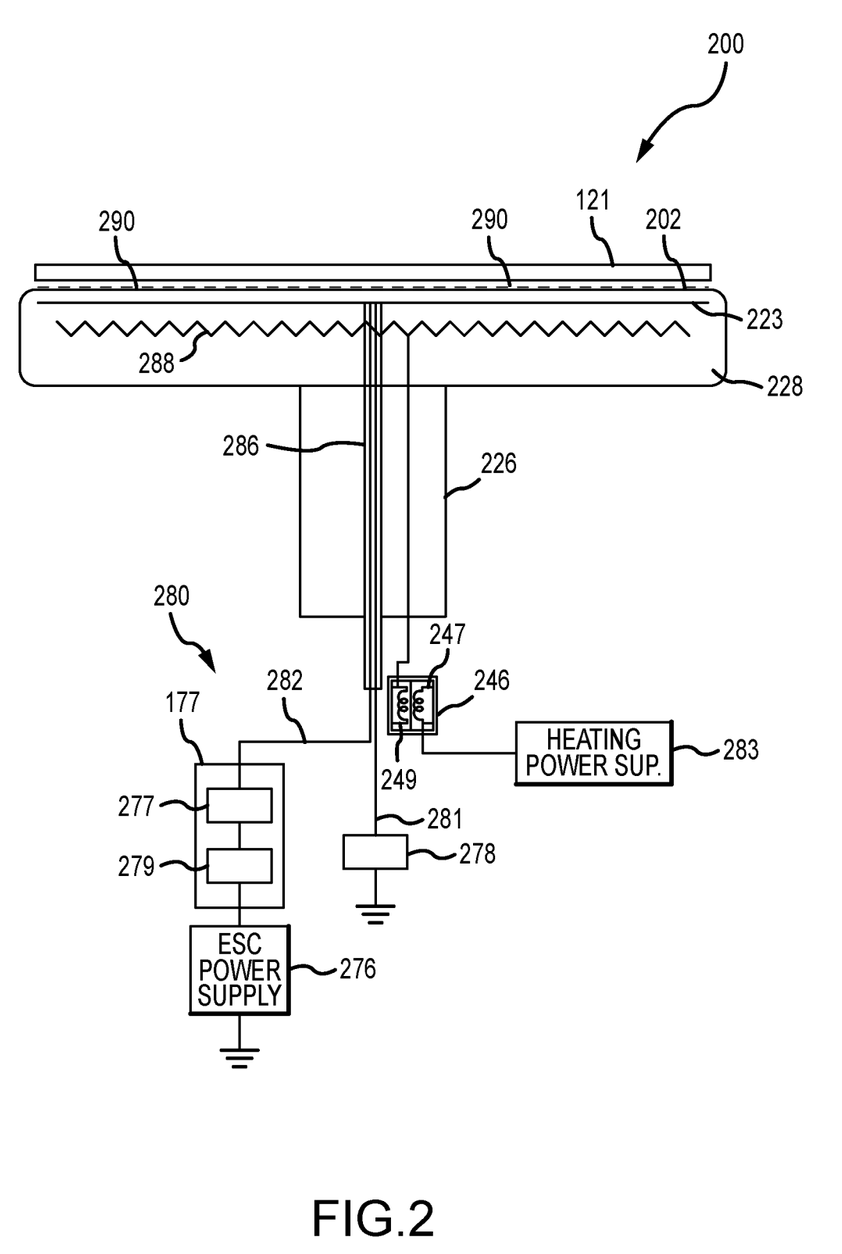
FIG. 2 shows a schematic cross-sectional view of an exemplary electrostatic chuck and exemplary power supply system according to some embodiments of the present technology.

FIG. 2 shows a schematic cross-sectional view of an exemplary electrostatic chuck according to some embodiments of the present technology. The electrostatic chuck 200 comprises the chuck body 228 coupled to the support stem 226. The body 228 has a top surface 202 configured to provide support and clamp the substrate 121 during processing. The body 228 of the electrostatic chuck 200 comprises the electrode 223 coupled to a conductive member 286. The electrode 223 may be a metal electrode of comparable size to the substrate inside the body 228, and may be built to be substantially parallel to the substrate 121, which will be held against the top surface 202 of the body 228. The electrode 223 may be arranged in any configuration or pattern such that the electrodes are evenly distributed across the top surface 202. For example, the electrode 223 may be arranged in a grid-like, a pixel-like or dot-like configuration. The conductive member 286 may be a rod, a tube, wires, or the like, and be made of a conductive material, such as molybdenum (Mo), tungsten (W), or other material with a substantially similar coefficient of expansion with other materials comprising the body 228. In some embodiments, the top surface 202 of the body 228 may have various patterns of surface contacts 290, which may be arranged close to and/or in contact with the back side area of the substrate 121 to affect chucking force and timing performance.

In one embodiment, the electrostatic chuck uses a single electrode 223 to maintain substantially uniform voltage between the electrode 223 and the substrate 121. Alternatively, the electrostatic chuck may use bipolar ESC where multiple chucking electrodes with different voltages are used to generate the clamping force. In some embodiments, the electrostatic chuck 200 may have a biasing electrode embedded or disposed in the body 228 to provide an electrical bias to the substrate to promote or enhance the electrostatic clamping of the substrate. Alternatively, the electrode 223 may provide both a ground path for a radio frequency (RF) power (e.g., the RF source 109 in FIG. 1) and an electric bias to the substrate 121 to enable electrostatic clamping of a substrate.

In order to provide an electrical bias to the substrate 121, the electrode 223 may be in communication with a power supply system 280 that supplies a biasing voltage to the electrode 223. The power supply system 280 includes the power supply 276 that may be a direct current (DC) power source to supply a DC signal to the electrode 223. In one embodiment, the power supply 276 is a 24 V DC power supply and the electrical signal may provide a positive or negative bias.

Alternatively, or in addition, the power supply 276 may be an alternating current (AC) power source to provide a conditioned signal to the electrode 223 that varies over time. In such an embodiment, an AC power source provides a signal to the electrode. The signal includes a controlled waveform of a certain frequency, duty cycle, offset with respect to ground, and peak-to-peak value. These parameters can all be adjusted to achieve the best results given the heating profile and deposition characteristics desired. In one example, substrate temperature is controlled to remain in the range of 550 C to 650 C while the substrate is residing upon the chuck with ceramic heater 288, which is kept within the same temperature range. The substrate is chucked to the surface of the ceramic heater by the electrostatic force generated between the wafer and electrode 223. In this example, the voltage signal varies over time as a square wave of 20 Hz, 20% duty cycle, +/−1000 V, and 0 V offset. These values are not intended to be absolute. This example includes values around the given values, for example, within 10%.

The power supply 276 in one embodiment is coupled to electrode 223 through interface circuitry 177, which includes power supply amplifier 279 and filter 277. Examples of circuits that can be communicatively coupled between power supply 276 and electrode 223 to serve as filter 277 are discussed below. The power supply 276 may be coupled to power supply amplifier 279 to amplify the electrical signal from the power supply. The amplified electrical signal travels through filter 277 so that noise and any RF current from the biasing voltage from the power supply system 280 is removed from the amplified electrical signal. The amplified and filtered electrical signal is provided to the conductive member 286 by a connector 282. The amplified and filtered electrical signal is provided to the electrode 223 and the substrate 121 to enable electrostatic clamping of the substrate 121. The electrode 223 may also function as an RF ground, wherein RF power is coupled to ground by a connector 281. A capacitor 278 may be coupled to the ground path to prevent the biasing voltage from going to ground. In this manner, the electrode 223 functions as a substrate-biasing electrode and an RF return electrode.

In some embodiments, the body 228 may include one or more embedded heaters 288 to provide heat to the body 228. The heat from the heater 288 is then transferred to the substrate 121 to enhance a fabrication process, such as a deposition process. The heater 288 may or may not be positioned in parallel to the electrode 223. Although the heater 288 is shown in a position below the electrode 223, the electrode may be disposed along the same plane as, or above the heater 288. The heater 288 may be a single continuous metal line or may be in the form of discrete metal lines. The heater 288 may be any heating device that is suitable for providing inductive or resistive heating to the electrostatic chuck. A temperature sensor (not shown), such as a thermal couple, may be embedded in the body 228. The temperature sensor may be connected to a temperature controller (not shown) which provides control signal to a power supply 283 to control the temperature of the body 228.

The heater 288 is coupled to the heater power supply 283 through the support stem 226 to supply power to the heater 288. The power supply 283 may include a direct current (DC) power source, an alternating current (AC) power source, or a combination of both. In one embodiment, the power supply 283 is an alternating current (AC) power source to provide AC signal to the heater 288. The heater 288 may be composed of a resistive metal, a resistive metal alloy, or a combination of the two. Suitable materials for the heating elements may include those with high thermal resistance, such as tungsten (W), molybdenum (Mo), titanium (Ti), or the like. The heater 288 may also be fabricated with a material having thermal properties, e.g., coefficient of thermal expansion, substantially similar to that of the material comprising the body 228 to reduce stress caused by mismatched thermal expansion.

Generally, the resistivity of the AlN materials changes with temperature, which may result in increased coupling between the embedded chucking electrode 223 and the heaters 288 since they are physically close. Therefore, lower frequency signals and harmonic noise that exhibit primarily in the AC line side of the heater circuitry that would otherwise couple through the AlN dielectric chucking materials to the chucking electrode and affect the chucking voltage can be filtered by filter 277. Examples of the lower frequency signals include frequencies from 45 Hz to 65 Hz, which includes 50 Hz and 60 Hz standard line frequencies. The positioning of filter 277 shown in FIG. 2 is an example. The filter 277 may be disposed at any appropriate locations with respect to the electrostatic chuck, regardless of whether inside, or outside of a chamber environment, close by or remotely where they are further apart from noise sources.

An isolation transformer 246 can be disposed between the heater 288 and the heater power supply 283 in order to reduce leakage current through the heater. The isolation transformer 246 is used to cut off ground current path. In such a case, the isolation transformer 246 may include primary coil windings 247 and secondary coil windings 249. The primary coil windings 247 may be connected to the power supply 283 while the secondary coil windings 249 may be connected to the electrical load sought to be protected (i.e., the heater 288). Therefore, the heater 288 can be electrically isolated from the AC voltage source and any transients from the external source to reduce the leakage current. In most cases, the isolation transformer 246 should be designed to stand for the maximum ESC voltage without breaking down, while allowing no DC current across its primary and secondary coil windings. However, the AC current may pass freely between the primary and the secondary coil windings of the isolation transformer 246. Depending upon the configuration of the heater 288, the isolation transformer 246 could be a single-zone or multi-zone isolated transformer. In cases where the electrostatic chuck including multiple heating zones, multiple transformers or a single transformer with multiple primary and, or secondary coil windings may be used to maintain DC isolation between the heaters to ground.

Filter 277 can include various passive and active circuits to remove AC noise depending on the spectrum of frequencies in the noise that needs to be removed. Filter 277 can remove noise introduced by operating the ceramic heater while the electrostatic force on the substrate is maintained. In some examples, AC line frequency components based on a power line frequency of 50 Hz or 60 Hz, including harmonics of these frequencies up to several kHz can be targeted. Such a filter can have various configurations including those of low-pass, high-pass, band-pass, band-rejection, and notch filters. As a further example, consider AC noise coupled into the DC or lower-frequency square-wave chucking signal while running a 3.4 µm of carbon film deposition at 630 C. The chucking signal level may be affected by such AC noise components. When measured, such noise typically appears as periodic, or to include a specific frequency or multiple frequency components. For example, noise consisting of 60 Hz switching noise typically includes harmonic frequencies of up to several kHz.

In one embodiment, filter 277 is a passive circuit having an iron core inductor with 25 mH of inductance, though various inductances can be used. For 60 Hz switching noise, the 25 mH iron core inductor results in attenuation factors of 50 dB, 13.8 dB, and 1.4 dB at the frequencies of 13.56 MHz, 1800 Hz, and 180 Hz, respectively, which is about 7% of the ESC current noise level, i.e., 25±2 mA as tested with a chamber and process as described above.

Figure 3:
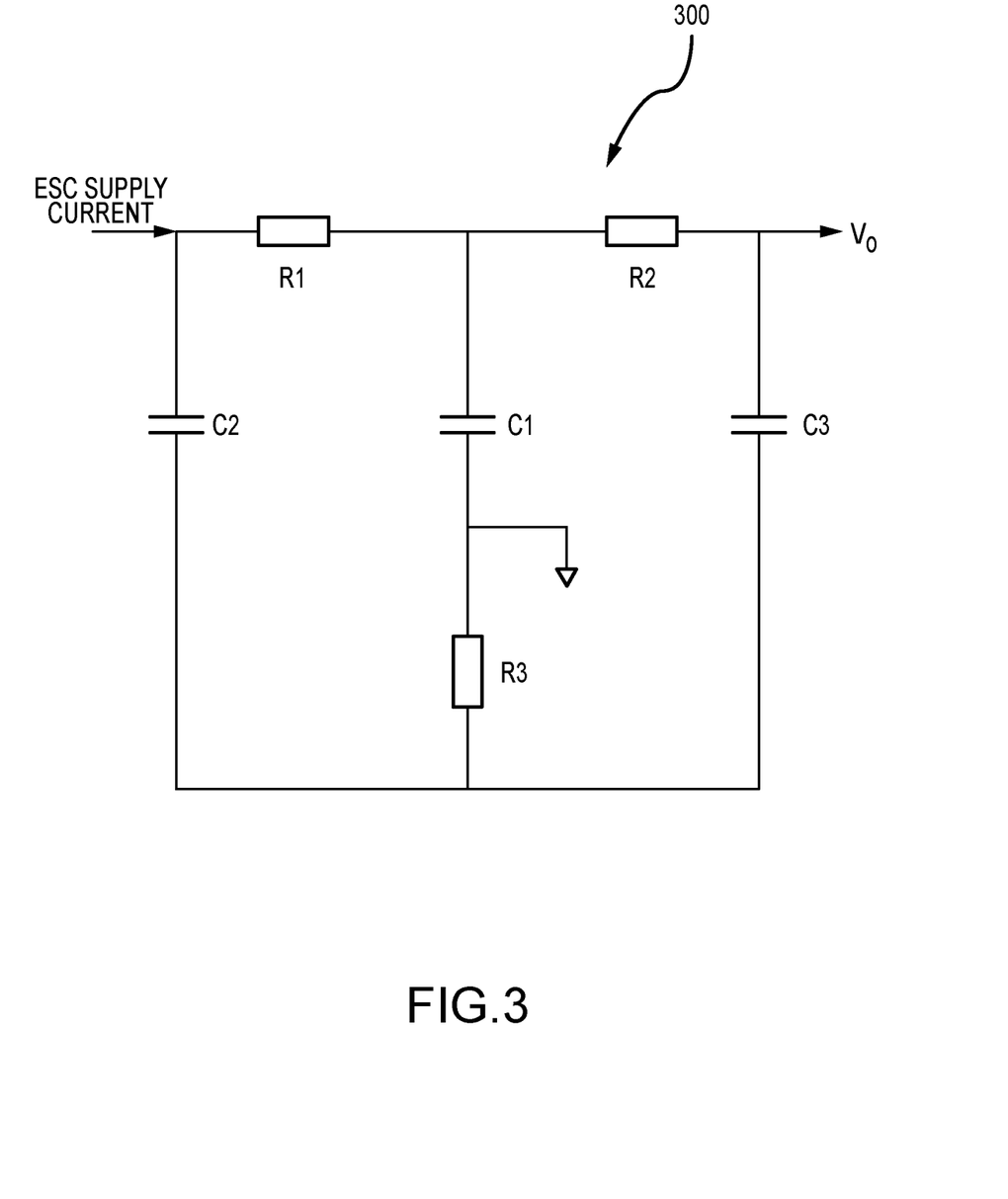
FIG. 3 shows a schematic diagram of an exemplary filter circuit according to some embodiments of the present technology.

FIG. 3 shows a schematic diagram of another exemplary passive filter circuit according to some embodiments of the present technology. Circuit 300 is a passive twin-T band rejection filter. The filter includes resistive and capacitive elements forming a network of two T-circuits with a noise attenuation factor of greater than 40 dB at the designed frequency. The attenuation value and frequency response are related to the specific values of the resistors and the capacitors. In one embodiment, a first T-circuit includes resistors R1 and R2 and capacitor C1, while a second T-circuit includes resistor R3 and capacitors C2 and C3. In this example, the resistance value for each of the resistors R1 and R2 in the first T-circuit is about twice the resistance value for the resistor R3 in the second T-circuit. Similarly, the capacitance value for the capacitor C1 in the first T-circuit is about twice the capacitance value for the capacitors C2 and C3 in the second T-circuit. In this example, the values are set as close as possible to these relative values given standard values for widely available components and a 5% tolerance.

In one example, a filter as described above is implemented with resistance values of 10 MΩ and 5 MΩ and with capacitance values of 530 pF and 260 pF. These values provide filtering for noise signal with a fundamental frequency of 60 Hz, 7.8 VDC+4 Vpp (50%), for example, to provide attenuation to 2.55 Vdc+0.06 Vpp (2%). Such a noise signal can result, as an example, during chemical vapor deposition processing at temperatures from 550 C to 650 C. Variations in the ESC power supply current and voltage are reflected linearly in the filter output level at output terminal Vo. The output impedance of circuit 300 is around 100 kΩ, matching the impedance of a typical isolation amplifier circuit that might be used with an ESC.

Figure 4:
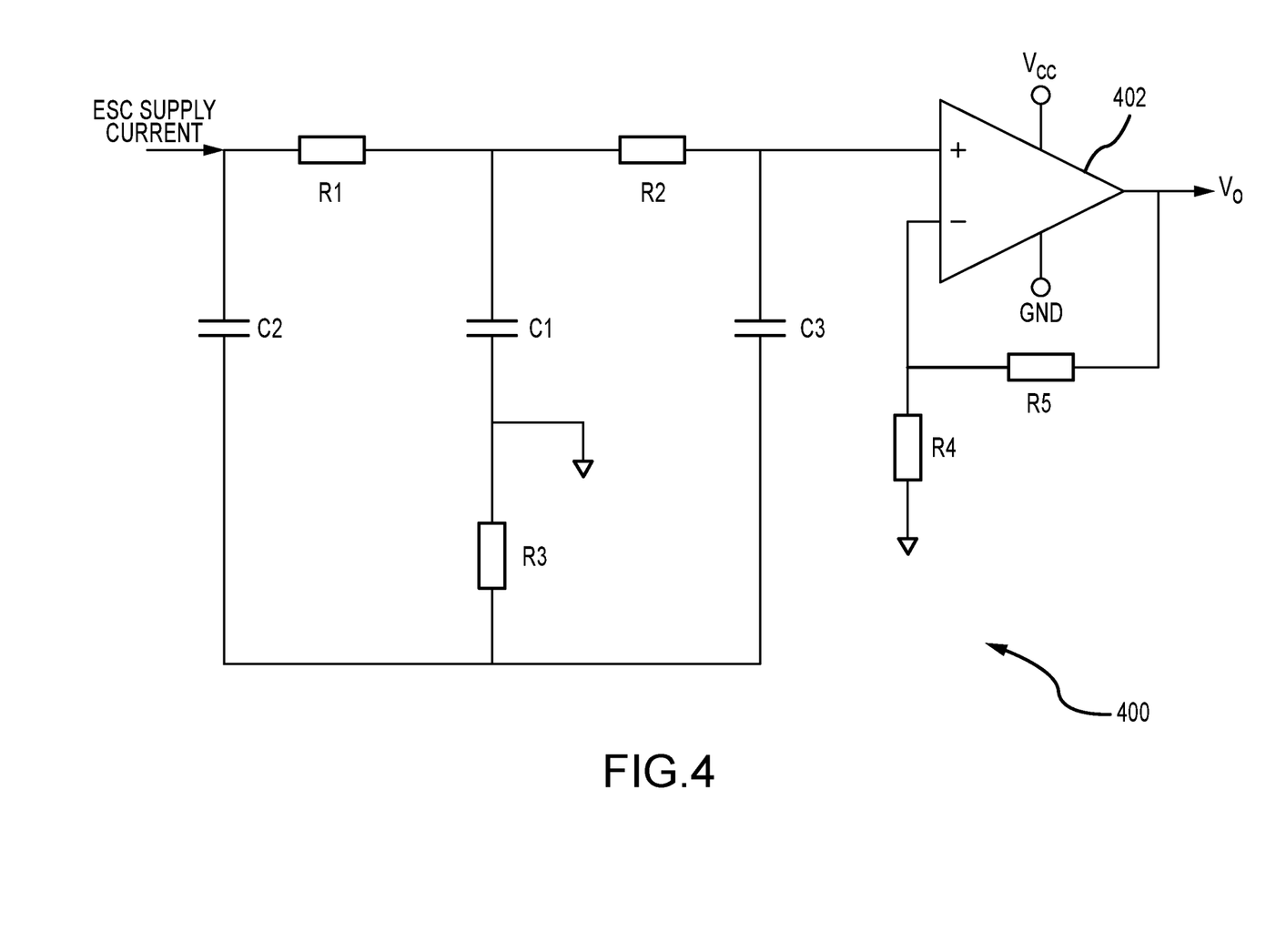
FIG. 4 shows a schematic diagram of another exemplary filter circuit according to some embodiments of the present technology.

FIG. 4 shows a schematic diagram of exemplary active filter circuit according to some embodiments of the present technology. Filter circuit 400 includes an active stage built around operational amplifier 402 and a passive stage including the passive filter circuit described above. Operational amplifier 402 adjusts the gain applied to the incoming signals so that a DC or peak output signal level from the filter corresponds to a DC or peak input signal level. This signal level matching ensures that the filter appears to be transparent to or have no effect on the operation of the power supply system other than providing noise attenuation. In the example shown in FIG. 4, gain is set by using the operational amplifier 402 as a voltage follower with a high input impedance set by an adjustment circuit including resistors R4 and R5. Alternatively, gain can be set by connecting a resistance divider network to the operational amplifier.

In one example, a circuit like that above includes resistors and capacitors in the passive stage with the values previously discussed. The filter is applied to reduce noise with a fundamental frequency of about 60 Hz and measureable harmonics up to about 3 kHz. R4 has a value of about 5 MΩ. R5 is adjustable and in a typical system as described herein may be set to around 228 kΩ. Vcc is 20 V. The active filter response exhibits a notch centered at about 56 Hz. An active filter circuit can be configured to filter ESC current, ESC voltage, or both. Gain adjustment can be made, as examples, via firmware for a system controller (such as system controller 175) in the power supply system, via a variable resistor control that is accessible to an operator, or by designing the power supply system for a specific, known operating environment. The filter is transparent, meaning not only is the steady state chucking signal mostly unaffected, but also rise and fall times of an AC chucking signal do not substantially change. The filter also operates without substantially slowing down the chucking voltage rise time or de-chucking voltage fall time experienced by substrates as they are being processed.

Figure 5:
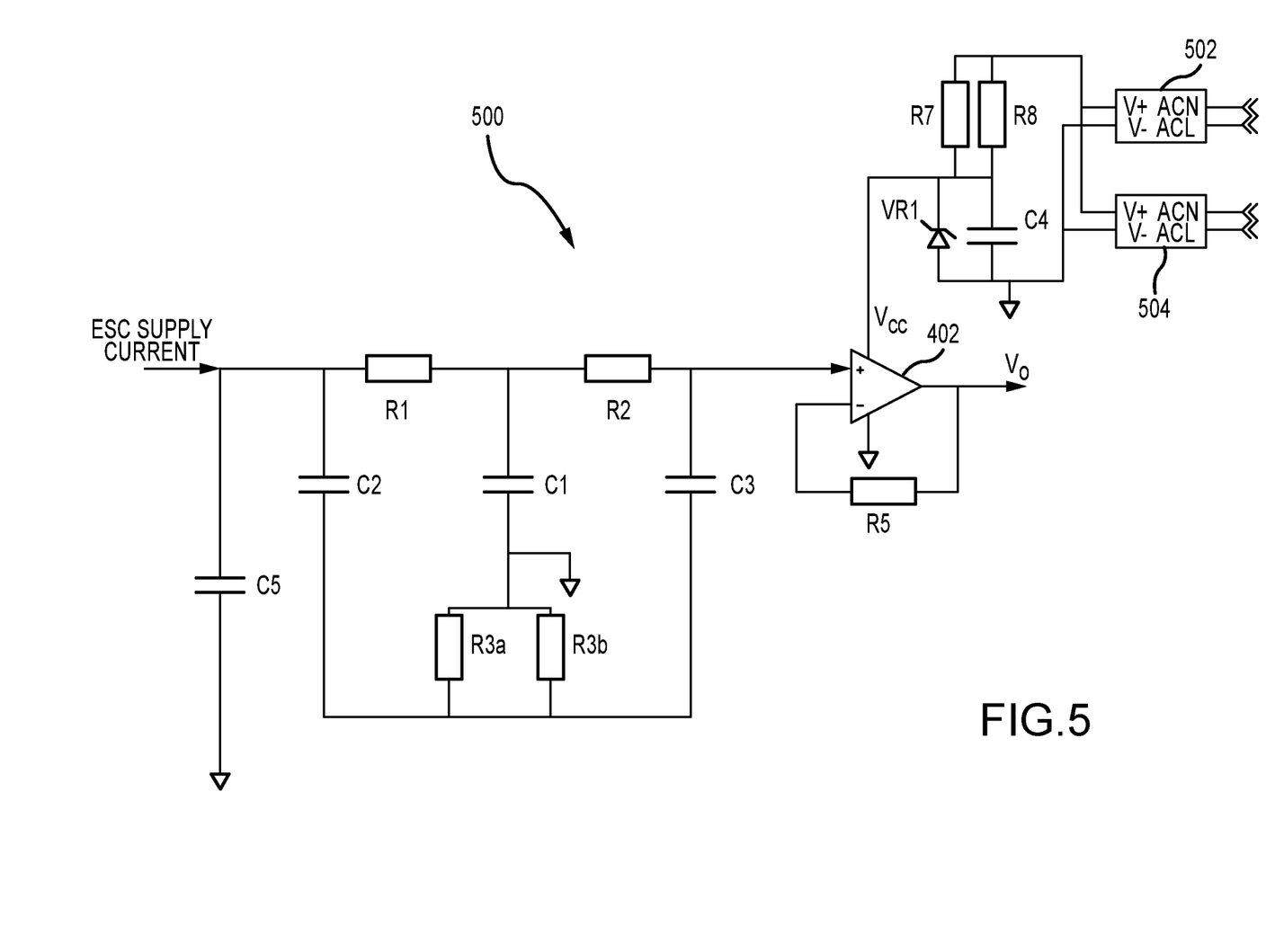
FIG. 5 shows a schematic diagram of an additional exemplary filter circuit according to some embodiments of the present technology.

FIG. 5 shows a schematic diagram of another exemplary active filter circuit according to some embodiments of the present technology. Filter circuit 500 again includes an active stage built around operational amplifier 402 and a passive stage including a passive filter circuit. Operational amplifier 402 adjusts the gain applied to the incoming signals for signal level matching. In the example shown in FIG. 5, gain is set by adjusting the value of R5 in any manner previously discussed. Vcc is supplied to operational amplifier 402 by two 208 VAC to 10 VDC power supplies 502 and 504 to achieve the necessary current. A single power supply of sufficient current capability could instead be used. These power supplies are connected to a voltage clamping circuit including R7, R8, C4, and diode VR1 in order to provide overvoltage protection. R7 and R8 are used in parallel to be able to tune the overall resistance value more closely using off-the-shelf resistors. The passive filter portion of circuit 500 also includes two resistors in parallel, R3a and R3b, in order to provide the resistance of R3 as shown in the previous figures. This again allows more precision in setting the resistance value using off-the-shelf components. A capacitor C5 is added to the input of circuit 500 to serve as a low pass filter.

Figure 6:
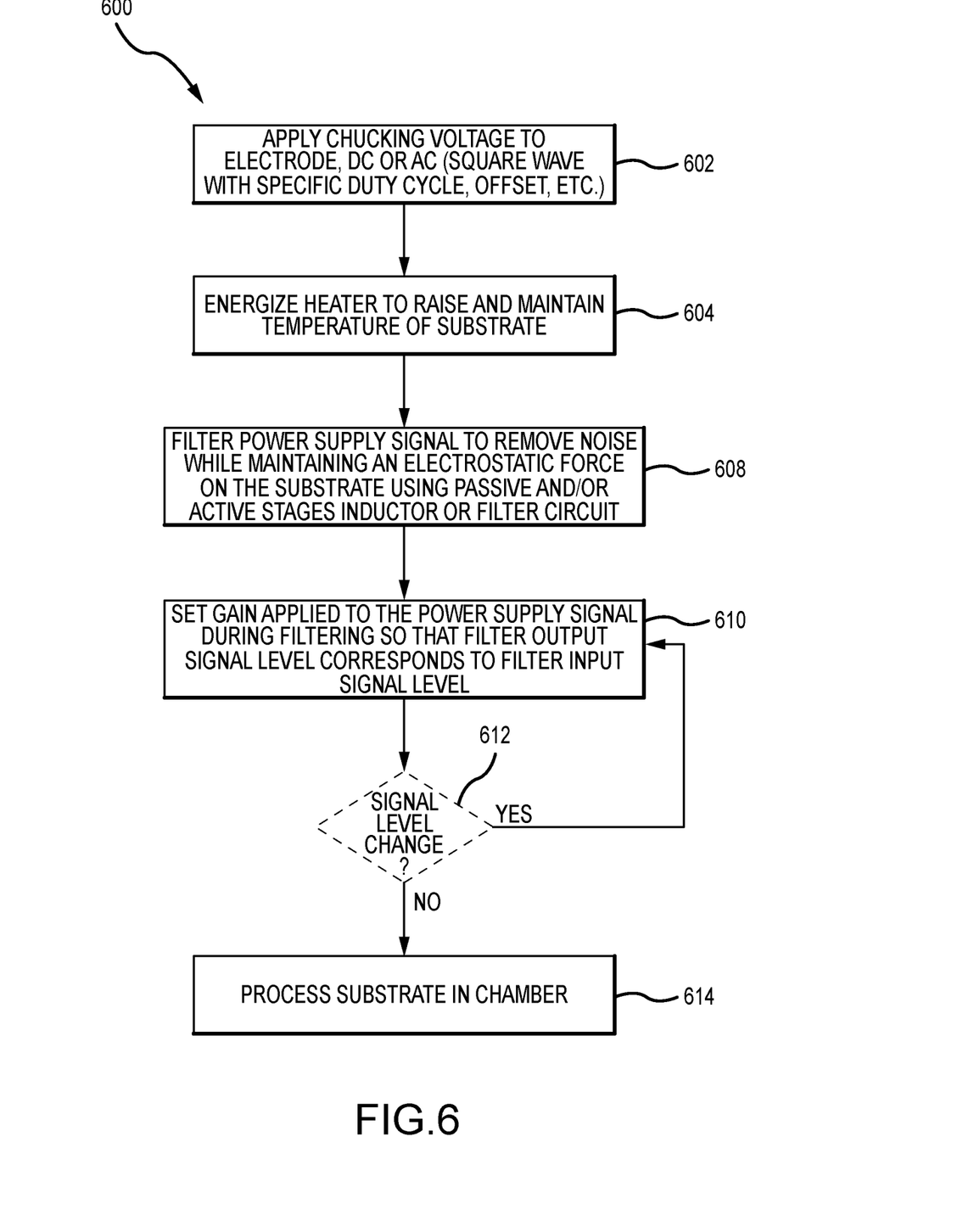
FIG. 6 shows a flowchart of a method for powering an electrode of an electrostatic chuck according to some embodiments of the present technology.

FIG. 6 shows a flowchart of a method for powering an electrode of an electrostatic chuck according to some embodiments of the present technology. Method 600 may be performed in one or more chambers, including the chamber previously described herein. Method 600 may make use of electrostatic chuck previously described herein, along with the filters and other components shown. Method 600 may include optional operations or conditions, which may or may not be specifically associated with some embodiments of the present technology. For example, many of the operations are described in order to provide a broader scope of the structures use, but are not critical to the technology, or may be performed by alternative methodology as would be readily appreciated. As will be appreciate from the description of the gain setting below, in some embodiments, the semiconductor processing system can be designed so that the gain can be actively monitored and adjusted, either via an automated feedback process or manually by an operator.

In operation 602 of method 600, chucking voltage is applied to chuck electrode 223. This voltage may be DC or AC, for example a square wave with a specific duty cycle, offset, etc. In operation 604, the ceramic heater 288 is energized to raise and maintain the temperature of the substrate being processed. In operation 608, the power supply signal is filtered to remove noise, while maintaining an electrostatic force on the substrate 121. In some embodiments, the filtering is accomplished in part by applying an attenuation of at least 40 dB at a designed frequency from 45 Hz to 65 Hz while the substrate is maintained at a temperature of from 550 C to 650 C. The filter may include passive stages, active stages, or both. The filter may also be based upon an inductor. In operation 610, the gain is set for the power supply signal to be applied during filtering so that the filter output signal level corresponds to the filter input signal level. Optionally, the signal level can be monitored in operation 612. If the signal level changes, the gain can be reset by repeating operation 610. Otherwise, the substrate 121 is processed in the chamber of the semiconductor processing system in operation 614.

Figure 7:
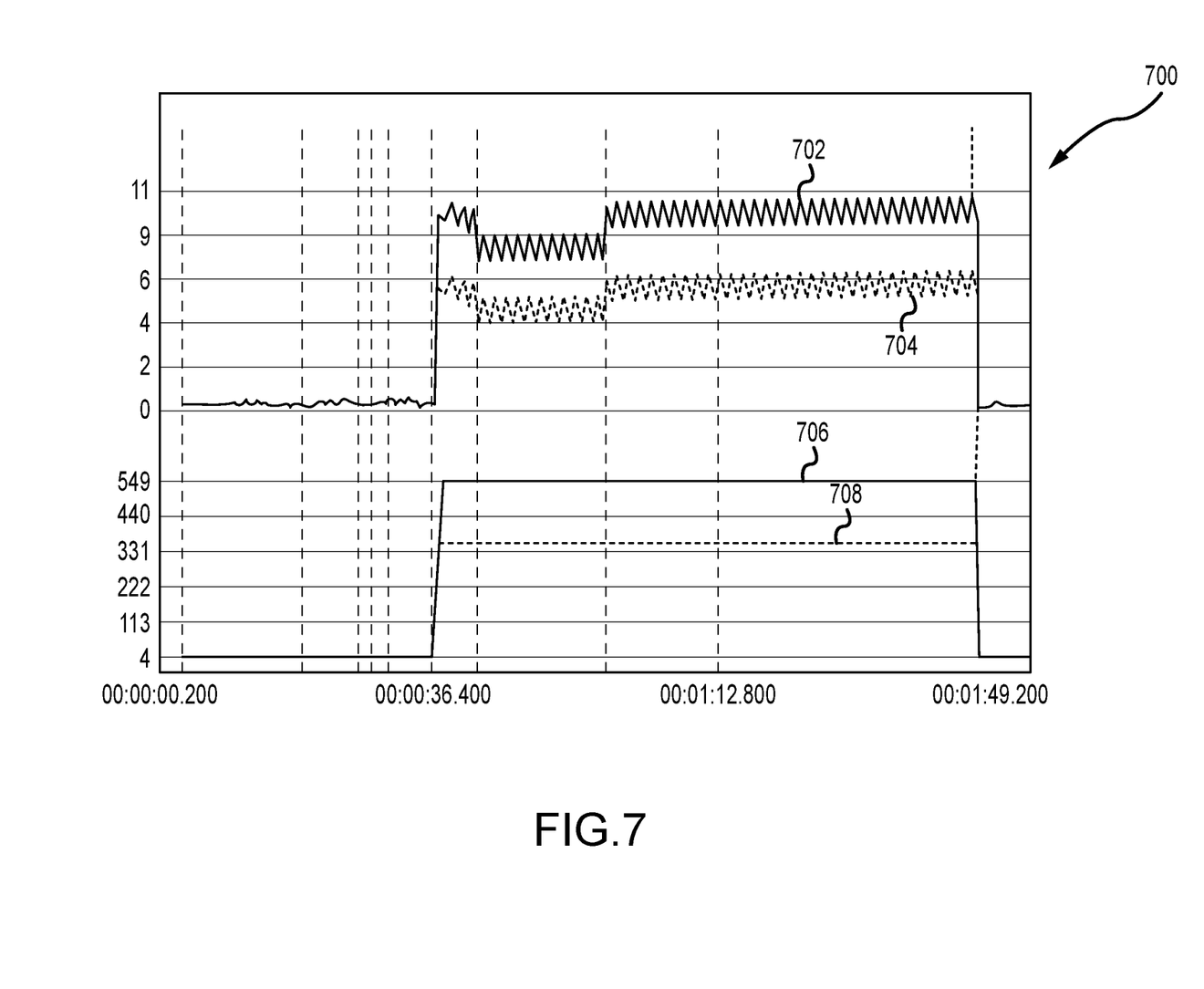
FIG. 7 shows a chart that illustrates the effects of filtering the power supplied to an electrostatic chuck according to some embodiments of the present technology.

FIG. 7 shows a chart that illustrates the effects of filtering the power supplied to an electrostatic chuck according to some embodiments of the present technology. Voltage waveform chart 700 shows an example of the ESC current and voltage noise attenuation before and after implementation of the active noise filter discussed above in a semiconductor processing system with a chamber with a ceramic heater temperature running between 550 C and 575 C. Waveform 702 represents the unfiltered ESC current and waveform 704 represents the unfiltered ESC voltage. Waveform 706 represents the filtered ESC current and waveform 708 represents the unfiltered ESC voltage. The high and low signal voltages are 550 V and 350 V, respectively. The original noise current fluctuation for the high voltage signal is about 2.5 mA at 0 V and the noise current fluctuation for the low voltage signal is less than 3 mA at zero volts.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a heater" includes a plurality of such heaters, and reference to "the filter" includes reference to one or more filters and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups. The words "coupled", "connected", "disposed" and similar terms may refer to a direct connection or placement between components, or a connection or placement with or among intervening components.

The invention claimed is:

1. A semiconductor processing system comprising:
a processing chamber;
an electrostatic chuck disposed at least partially within the processing chamber, the electrostatic chuck including at least one electrode and a heater;
a power supply to provide a signal to the at least one electrode to provide electrostatic force to secure a substrate to the electrostatic chuck; and
a filter communicatively coupled between the power supply and the at least one electrode, the filter configured to remove noise introduced by operating the heater, wherein the filter comprises a circuit configured to provide an attenuation of at least 40 dB at a designed frequency from 45 Hz to 65 Hz and to attenuate harmonics of the designated frequency up to about 3 kHz while the electrostatic force on the substrate is maintained.

2. The semiconductor processing system of claim 1 wherein the filter comprises a passive circuit including at least one of, a plurality of resistors and capacitors, or an inductor.

3. The semiconductor processing system of claim 1 wherein the circuit is configured to provide an attenuation of at least 40 dB at the designed frequency without substantially changing a rise time of a chucking voltage or a fall time of a de-chucking voltage when the heater increases a temperature of the substrate from 550 C to 650 C.

4. The semiconductor processing system of claim 3 wherein the filter comprises a twin-T band rejection circuit, wherein a first T-circuit includes at least one resistor having a resistance value about twice that of a resistor in a second T-circuit and a capacitor having a capacitance value about twice that of at least one capacitor in the second T-circuit.

5. The semiconductor processing system of claim 1 wherein the filter comprises:
a passive stage; and
an active stage communicatively coupled to the passive stage.

6. The semiconductor processing system of claim 5 wherein the active stage comprises:
an operational amplifier; and
an adjustment circuit communicatively coupled to the operational amplifier for setting a gain of the filter so that an output signal level from the filter corresponds to an input signal level for the filter.

7. The semiconductor processing system of claim 1 wherein the power supply is configured to provide a voltage that varies over time as a square wave of a frequency around 20 Hz, a duty cycle around 20%, a magnitude of around +/−1000 V, and a substantially 0 V offset.

8. A method of processing a substrate in a semiconductor processing system, the method comprising:
applying a chucking voltage to an electrostatic chuck supporting the substrate in a semiconductor processing chamber, wherein the chucking voltage varies over time as a square wave of a frequency from about 18 Hz to about 22 Hz, a duty cycle from about 18% to about 22%, and a magnitude of about +/−900 V to about +/−1100 V;
energizing a heater to raise a temperature of the substrate;
filtering a power supply signal providing the chucking voltage to remove noise introduced to the power supply signal by the heater while an electrostatic force on the substrate is maintained;
setting a gain applied to the power supply signal during the filtering so that an output signal level corresponds to an input signal level; and
processing the substrate in the semiconductor processing chamber.

9. The method of claim 8 wherein the power supply signal is filtered using a passive circuit including at least one of, a plurality of resistors and capacitors, or an inductor.

10. The method of claim 8 wherein filtering the power supply signal further comprises applying an attenuation of at least 40 dB at a designed frequency from 45 Hz to 65 Hz while the substrate is maintained at a temperature of from 550 C to 650 C.

11. The method of claim 10 wherein the power supply signal is filtered using a twin-T band rejection circuit, wherein a first T-circuit includes at least one resistor having a resistance value of about twice that of a resistor in a second T-circuit and a capacitor having a capacitance value about twice that of at least one capacitor in the second T-circuit.

12. The method of claim 8 wherein the power supply signal is filtered using a filter including a passive stage and an operational amplifier communicatively coupled to the passive stage.

13. The method of claim 10 wherein filtering the power supply signal further comprises applying an attenuation to harmonics of the designated frequency up to about 3 kHz.

14. A power supply system for electrostatic chucking in a semiconductor processing chamber, the power supply system comprising:
- a power supply configured to provide a signal to an electrode in an electrostatic chuck; and
- a filter communicatively coupled to the power supply, the filter configured to remove noise introduced by operating a heater in the electrostatic chuck while an electrostatic force on a substrate is maintained, wherein the filter comprises a twin-T band rejection circuit, wherein a first T-circuit includes at least one resistor having a resistance value about twice that of a resistor in a second T-circuit and a capacitor having a capacitance value about twice that of at least one capacitor in the second T-circuit.

15. The power supply system of claim 14 wherein the filter comprises a passive circuit including at least one of, a plurality of resistors and capacitors, or an inductor.

16. The power supply system of claim 14 wherein the filter comprises a circuit configured to provide an attenuation of at least 40 dB at a designed frequency from 45 Hz to 65 Hz with the heater maintaining a temperature of the substrate from 550 C to 650 C.

17. The power supply system of claim 16 wherein the circuit is further configured to apply an attenuation to harmonics of the designated frequency up to about 3 kHz.

18. The power supply system of claim 14 further comprising a power supply amplifier communicatively coupled between the power supply and the filter.

19. The power supply system of claim 14 wherein the filter includes an active stage and a passive stage, the active stage comprising:
- an operational amplifier; and
- an adjustment circuit communicatively coupled to the operational amplifier for setting a gain of the filter so that an output signal level from the filter corresponds to an input signal level for the filter.

20. The power supply system of claim 14 wherein the power supply is configured to provide a voltage that varies over time as a square wave of a frequency around 20 Hz, a duty cycle around 20%, a magnitude of around +/−1000 V, and a substantially 0 V offset.

\* \* \* \* \*